(12) United States Patent
Liu et al.

(10) Patent No.: US 11,990,428 B2
(45) Date of Patent: May 21, 2024

(54) BONDING STRUCTURES IN SEMICONDUCTOR PACKAGED DEVICE AND METHOD OF FORMING SAME

(71) Applicant: Taiwan Semiconductor Manufacturing Co., Ltd., Hsinchu (TW)

(72) Inventors: Hao Chun Liu, Hsinchu (TW); Ching-Wen Hsiao, Hsinchu (TW); Kuo-Ching Hsu, Chung-Ho (TW); Mirng-Ji Lii, Sinpu Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 2 days.

(21) Appl. No.: 17/813,069

(22) Filed: Jul. 18, 2022

(65) Prior Publication Data

US 2022/0352094 A1 Nov. 3, 2022

Related U.S. Application Data

(62) Division of application No. 16/265,136, filed on Feb. 1, 2019, now Pat. No. 11,393,771.

(Continued)

(51) Int. Cl.
*H01L 21/56* (2006.01)
*H01L 21/78* (2006.01)
(Continued)

(52) U.S. Cl.
CPC .......... *H01L 23/562* (2013.01); *H01L 21/563* (2013.01); *H01L 21/78* (2013.01); *H01L 23/3185* (2013.01); *H01L 23/585* (2013.01);

*H01L 24/11* (2013.01); *H01L 24/13* (2013.01); *H01L 24/16* (2013.01); *H01L 24/81* (2013.01);
(Continued)

(58) Field of Classification Search
CPC .............................. H01L 21/78; H01L 23/585
See application file for complete search history.

(56) References Cited

U.S. PATENT DOCUMENTS 7,339,256 B2   3/2008  Nakamura et al.
8,993,380 B2   3/2015  Hou et al.
(Continued)

FOREIGN PATENT DOCUMENTS

CN    100477177 C    4/2009
CN    103000598 A    3/2013
(Continued)

*Primary Examiner* — Moazzam Hossain
*Assistant Examiner* — Hajar Kolahdouzan
(74) *Attorney, Agent, or Firm* — Slater Matsil, LLP

(57) ABSTRACT

A semiconductor device and a method of forming the same are provided. The semiconductor device includes a die structure including a plurality of die regions and a plurality of first seal rings. Each of the plurality of first seal rings surrounds a corresponding die region of the plurality of die regions. The semiconductor device further includes a second seal ring surrounding the plurality of first seal rings and a plurality of connectors bonded to the die structure. Each of the plurality of connectors has an elongated plan-view shape. A long axis of the elongated plan-view shape of each of the plurality of connectors is oriented toward a center of the die structure.

20 Claims, 16 Drawing Sheets

Related U.S. Application Data

(60) Provisional application No. 62/737,531, filed on Sep. 27, 2018.

(51) Int. Cl.
  *H01L 23/00* (2006.01)
  *H01L 23/31* (2006.01)
  *H01L 23/58* (2006.01)

(52) U.S. Cl.
  CPC ............... *H01L 2224/1146* (2013.01); *H01L 2224/11849* (2013.01); *H01L 2224/13026* (2013.01); *H01L 2224/16227* (2013.01); *H01L 2224/81815* (2013.01); *H01L 2924/35121* (2013.01)

(56) References Cited

U.S. PATENT DOCUMENTS

| | | |
|---|---|---|
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2006/0216860 A1* | 9/2006 | Pendse ............ H01L 24/29 257/E23.068 |
| 2008/0017965 A1 | 1/2008 | Nomura et al. |
| 2013/0043566 A1 | 2/2013 | Nakano et al. |
| 2013/0062755 A1 | 3/2013 | Kuo et al. |
| 2016/0020181 A1 | 1/2016 | Yu et al. |
| 2016/0086905 A1 | 3/2016 | Aleksov et al. |
| 2017/0271291 A1 | 9/2017 | Cha et al. |
| 2018/0047690 A1 | 2/2018 | Chuang et al. |
| 2018/0122754 A1* | 5/2018 | Tatour ............ H01L 21/78 |

FOREIGN PATENT DOCUMENTS

| | | |
|---|---|---|
| JP | 2005229086 A | 8/2005 |
| JP | 2008027934 A | 2/2008 |
| KR | 20070107154 A | 11/2007 |
| TW | 201411786 A | 3/2014 |
| TW | 201630142 A | 8/2016 |
| WO | 2006105015 A2 | 10/2006 |
| WO | 2012095907 A1 | 6/2014 |

\* cited by examiner

BONDING STRUCTURES IN SEMICONDUCTOR PACKAGED DEVICE AND METHOD OF FORMING SAME

PRIORITY CLAIM AND CROSS-REFERENCE

This application is a divisional of U.S. patent application Ser. No. 16/265,136, filed on Feb. 1, 2019, now U.S. Pat. No. 11,393,771, issued Jul. 19, 2022, which claims the benefit of U.S. Provisional Application No. 62/737,531, filed on Sep. 27, 2018, each application is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area or smaller heights than conventional packages, in some applications.

Thus, new packaging technologies have begun to be developed. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
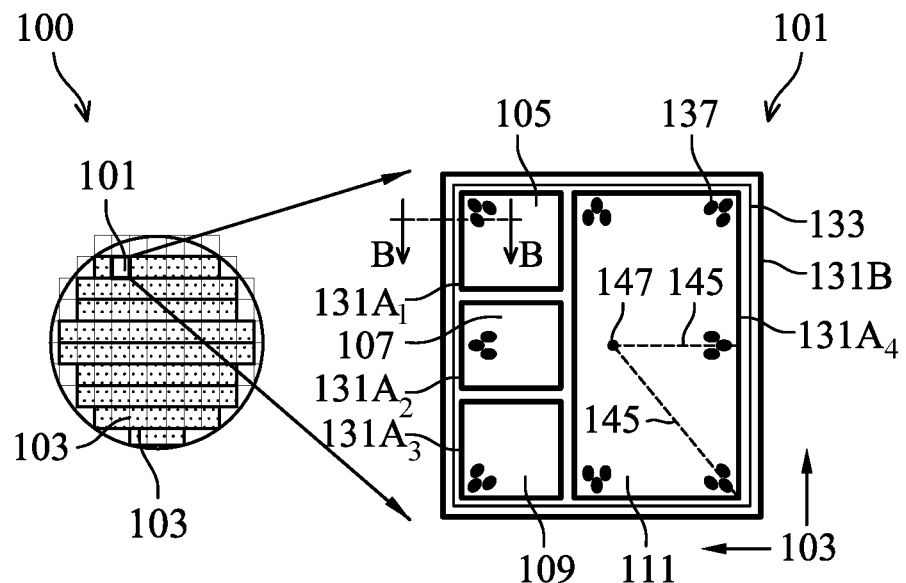
FIGS. 1A and 1B illustrate top and cross-sectional views of a wafer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely bonding structures (such as bump-on-pad structures) used in an integrated circuit package and methods of forming the same. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, or the like, or mounting input components, boards, dies or other components, or for connection packaging or mounting combinations of any type of integrated circuits or electrical components.

Various embodiments described herein allow for forming connectors or bonding structures used for bonding a multi-die structure to a substrate, such that bonding structures have elongated shapes that are aligned along lines emanating from a center of the multi-die structure or the substrate. Various embodiments described herein further allow for forming seal ring structures in a multi-die structure. Various embodiments described herein further allow for reducing stress exerted on various layers of the multi-die structure (such as, for example, low-k dielectric layers) that arises due to the coefficient of thermal expansion (CTE) mismatch between the multi-die structure and the substrate. Furthermore, the stress exerted on the bonding structures is also reduced that improves electrical and mechanical performance of the bonding structures.

Figure 1B:
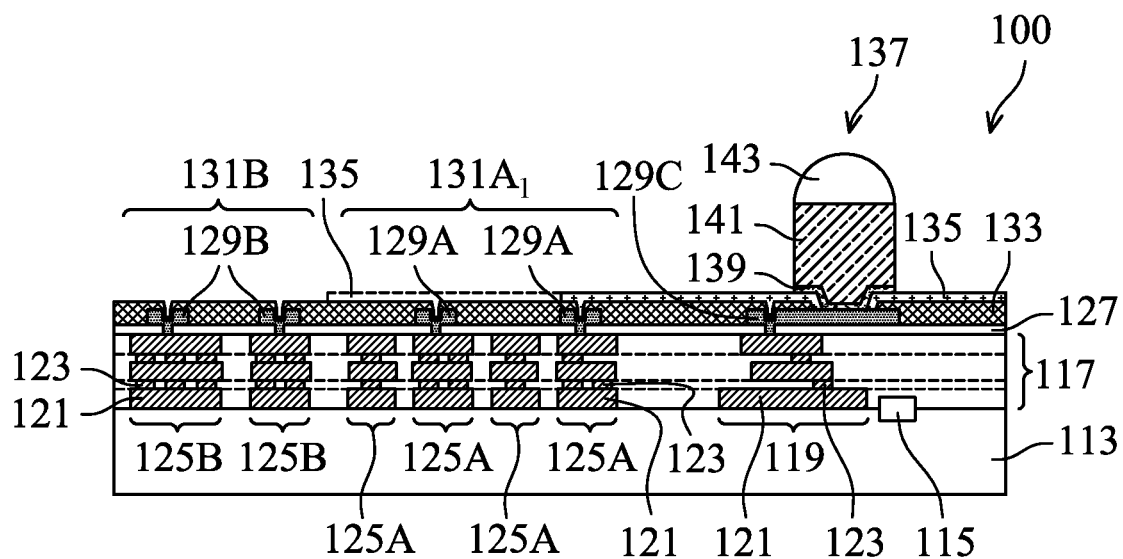

FIGS. 1A and 1B illustrate top and cross-sectional views of a wafer 100 in accordance with some embodiments. FIG. 1A illustrates a top view of the wafer 100, while FIG. 1B illustrates a cross-sectional view of the wafer 100 along a line BB shown in FIG. 1A. In some embodiments, the wafer 100 comprises unit regions 101 separated by scribe lines 103 (also referred to as dicing lines or dicing streets). As described below in greater detail, the wafer 100 is to be diced along the scribe lines 103 to form individual die structure (such as a die structure 801 illustrated in FIG. 8). In some embodiments, each unit region 101 is a multi-die structure comprising a plurality of die regions, such as die regions 105, 107, 109 and 111. Each of the die regions 105, 107, 109 and 111 may comprise an integrated circuit device, such as a logic device, memory device (e.g., SRAM), RF device, input/output (I/O) device, system-on-chip (SoC) device, combinations thereof, or other suitable types of devices.

In some embodiments, the wafer 100 comprises a substrate 113 and one or more active and/or passive devices 115 on the substrate 113. In some embodiments, the substrate 113 may be formed of silicon, although it may also be formed of other group III, group IV, and/or group V elements, such as silicon, germanium, gallium, arsenic, and combinations thereof. The substrate 113 may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like. In some embodiments, the one or more active and/or passive devices 115 may include various n-type metal-oxide semiconductor (NMOS) and/or p-type metal-oxide semiconductor (PMOS) devices such as transistors, capacitors, resistors, diodes, photo-diodes, fuses and/or the like.

Dielectric layers 117 are formed over the substrate 113 and the one or more active and/or passive devices 115. The dielectric layers 117 may include an inter-layer dielectric (ILD)/inter-metal dielectric layers (IMDs). The ILD/IMDs may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as a spin-on coating method, chemical vapor deposition (CVD), plasma enhanced CVD (PECVD), a combination thereof, or the like. The dielectric layers 117 may include conductive interconnect structures 119. In some embodiments, the interconnect structures 119 may comprise conductive lines 121 and conductive vias 123. In some embodiment, the interconnect structures 119 may be formed in the dielectric layers 117 using, for example, a damascene process, a dual damascene process, or the like. In some embodiments, the interconnect structures 119 may comprise copper, a copper alloy, silver, gold, tungsten, tantalum, aluminum, or the like. The interconnect structures 119 electrically interconnect the one or more active and/or passive devices 115 on the substrate 113 to form functional circuits within the die regions 105, 107, 109, and 111.

Dielectric layers 117 may further include seal ring portions 125A and 125B extending through dielectric layers 117. The seal ring portions 125A may be disposed at edge areas of the die regions 105, 107, 109, and 111 and, in a plan view, the seal ring portions 125A may encircle or surround interior portions of the die regions 105, 107, 109, and 111. The seal ring portions 125B may be disposed at edge areas of the unit regions 101 and, in a plan view, the seal ring portions 125B may encircle or surround interior portions of the unit regions 101. Each of the seal ring portions 125B may encircle or surround corresponding seal ring portions 125A. In some embodiments, the seal ring portions 125A and 125B may include conductive lines 121 and conductive vias 123 and may be formed using similar materials and processes as the interconnect structures 119. For example, the same processes used to form the interconnect structures 119 may simultaneously form the seal ring portions 125A and 125B. In some embodiments, the seal ring portions 125A and 125B may be electrically isolated from each other. In some embodiments, the seal ring portions 125A and 125B may be electrically isolated from the interconnect structures 119.

In some embodiments, a passivation layer 127 is formed over the dielectric layers 117, the interconnect structures 119, and the seal ring portions 125A and 125B. In some embodiments, the passivation layer 127 may comprise one or more layers of non-photo-patternable dielectric materials such as silicon nitride, silicon oxide, phosphosilicate glass (PSG), borosilicate glass (BSG), boron-doped phosphosilicate glass (BPSG), a combination thereof, or the like, and may be formed using CVD, physical vapor deposition (PVD), atomic layer deposition (ALD), a spin-on coating process, a combination thereof, or the like. In other embodiments, the passivation layer 127 may comprise one or more layers of photo-patternable insulating materials such as polybenzoxazole (PBO), polyimide (PI), benzocyclobutene (BCB), or the like, and may be formed using a spin-on coating process, or the like. Such photo-patternable dielectric materials may be patterned using similar photolithography methods as a photoresist material.

After forming the passivation layer 127, conductive pads 129A, 129B, and 129C are formed over the passivation layer. The conductive pads 129A are physically connected to respective seal ring portions 125A. The conductive pads 129B are physically connected to respective seal ring portions 125B. The conductive pads 129C are physically connected to respective interconnect structures 119. In some embodiments, the conductive pads 129A, 129B, and 129C comprise a conductive material such as aluminum, copper, tungsten, silver, gold, a combination thereof, or the like. In some embodiments, the passivation layer 127 may be patterned using suitable photolithography and etching methods to expose the interconnect structures 119 and the seal ring portions 125A and 125B. A suitable conductive material is formed over the passivation layer 127 and over the exposed portions of the interconnect structures 119 and the seal ring portions 125A and 125B using, for example, PVD, ALD, electro-chemical plating, electroless plating, a combination thereof, or the like. Subsequently, the conductive material is patterned to form the conductive pads 129A, 129B, and 129C. In some embodiments, the conductive material may be patterned using suitable photolithography and etching methods. Each of the conductive pads 129A may encircle or surround an interior portion of a respective one of the die regions 105, 107, 109, and 111. Each of the conductive pads 129B may encircle or surround an interior portion of a respective one of the unit regions 101.

The seal ring portions 125A and the conductive pads 129A form seal rings $131A_1$-$131A_4$, with each of the seal rings $131A_1$-$131A_4$ encircling an interior portion of a respective one of the die regions 105, 107, 109, and 111. The seal ring portions 125B and the conductive pads 129B form a seal ring 131B encircling an interior portion of a respective one of the unit regions 101. Each of the seal rings 131B encircles respective ones of the seal rings 131A$_1$-131A$_4$. In some embodiments, the seal rings 131A$_1$-131A$_4$ and 131B may be electrically isolated from each other. In some embodiments, the seal rings 131A$_1$-131A$_4$ and 131B may be electrically isolated from the interconnect structures 119. In some embodiments, the seal rings 131A$_1$-131A$_4$ and 131B may have a substantially similar structure. In other embodiments, the seal rings 131A$_1$-131A$_4$ and 131B may have different structures.

After forming the conductive pads 129A, 129B, and 129C, a passivation layer 133 is formed over the conductive pads 129A, 129B, and 129C and a buffer layer 135 is formed over the passivation layer 133. The passivation layer 133 may be formed using similar materials and methods as the passivation layer 127 and description is not repeated herein. In some embodiments, the passivation layer 133 and the passivation layer 127 comprise a same material. In other embodiments, the passivation layer 133 and the passivation layer 127 comprise different materials. In some embodiments, the buffer layer 135 may comprise one or more layers of photo-patternable insulating materials such as polybenzoxazole (PBO), polyimide (PI), benzocyclobutene (BCB), a combination thereof, or the like, and may be formed using a spin-on coating process, or the like. In some embodiments, the buffer layer 135 partially (as illustrated by a solid line portion of the buffer layer 135 in FIG. 1B) or fully (as illustrated by a dashed line portion of the buffer layer 135 in FIG. 1B) covers the seal rings 131A$_1$-131A$_4$, while exposing the seal rings 131B.

After forming the buffer layer 135, connectors 137 are formed over respective conductive pads 129C. In some embodiments, each of the connectors 137 extends through the buffer layer 135 and the passivation layer 133 and physically contacts a respective one of the conductive pads 129C. In some embodiments, each of the connectors 137 comprises an under-bump metallurgy (UBM) layer 139, a conductive pillar 141 over the UBM layer 139, and a solder layer 143 over the conductive pillar 141. In some embodiments, UBM layer 139 includes a diffusion barrier layer and a seed layer (not individually shown). The diffusion barrier layer may be formed of tantalum nitride, titanium nitride, tantalum, titanium, a combination thereof, or the like. The seed layer may be a copper seed layer formed on the diffusion barrier layer. The copper seed layer may be formed of copper or one of copper alloys that include silver, chromium, nickel, tin, gold, and combinations thereof. In some embodiments, the UBM layer 139 includes a diffusion barrier layer formed of Ti and a seed layer formed of Cu. The conductive pillar 141 comprises a conductive material such as copper, tungsten, aluminum, silver, gold, a combination thereof, or the like. In some embodiments, the solder layer 143 comprises suitable solder materials. The solder materials may be lead-based solders such as PbSn compositions, lead-free solders including InSb, tin, silver, and copper ("SAC") compositions, and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free solders also include SnCu compounds, without the use of silver (Ag), and SnAg compounds, without the use of copper (Cu).

Referring further to FIG. 1A, in some embodiments, the connectors 137 have elongated plan-view shapes. The elongated plan-view shapes may be oval shapes, elliptical shapes, racetrack shapes, or the like. The connectors 137 are arranged such that a line 145 extending along a long axis of an elongated plan-view shape of each of the connectors 137 intersects with a center 147 of a respective one of the unit region 101. The number and locations of the connectors 137 as illustrated in FIG. 1A are provided as an example only. In other embodiments, the number and locations of the connectors 137 may be varied according to design requirements of the resulting packaged device. In some embodiments, the center 147 may be a center of an area enclosed by the seal ring 131B.

Figure 2:
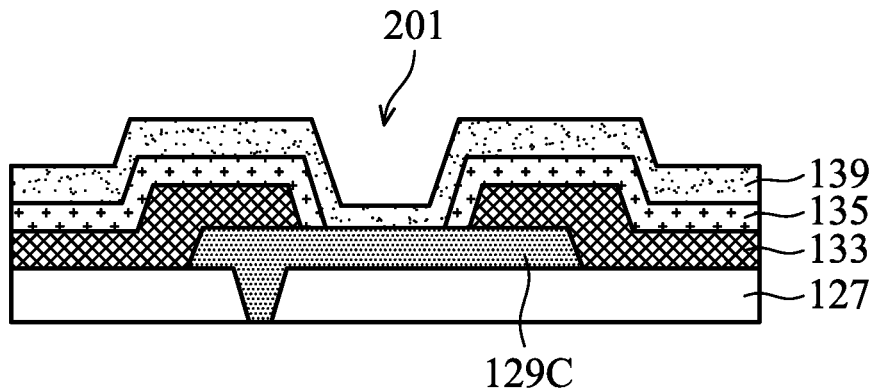
FIGS. 2 through 7 illustrate the cross-sectional views of intermediate stages in the formation of connectors in accordance with some embodiments.

FIGS. 2 through 7 illustrate the cross-sectional views of intermediate stages in the formation of the connectors 137 (see FIGS. 1A and 1B) in accordance with some embodiments. The formation method is described with respect to one of the connectors 137, since rest of the connectors 137 are also formed in a similar manner during the same formation process. Referring to FIG. 2, after forming the passivation layer 133 over the conductive pad 129C, an opening 201 is formed in the passivation layer 133 to expose a portion of the conductive pad 129C. In some embodiments where the passivation layer 133 comprises a non-photo-patternable dielectric material, the passivation layer 133 may be patterned using suitable photolithography and etching methods. After forming the opening 201, the buffer layer 135 is formed over the passivation layer and in the opening 201. The buffer layer 135 is patterned to remove a portion of the buffer layer 135 in the opening 201 to expose the conductive pad 129C. In some embodiments, the buffer layer 135 may be patterned using a suitable photolithography technique. After patterning the buffer layer 135, the UBM layer 139 is blanket deposited over the buffer layer 135 and in the opening 201. In some embodiments, various layer of the UBM layer 139 may be formed by ALD, PVD, sputtering, a combination thereof, or the like.

Figure 3:
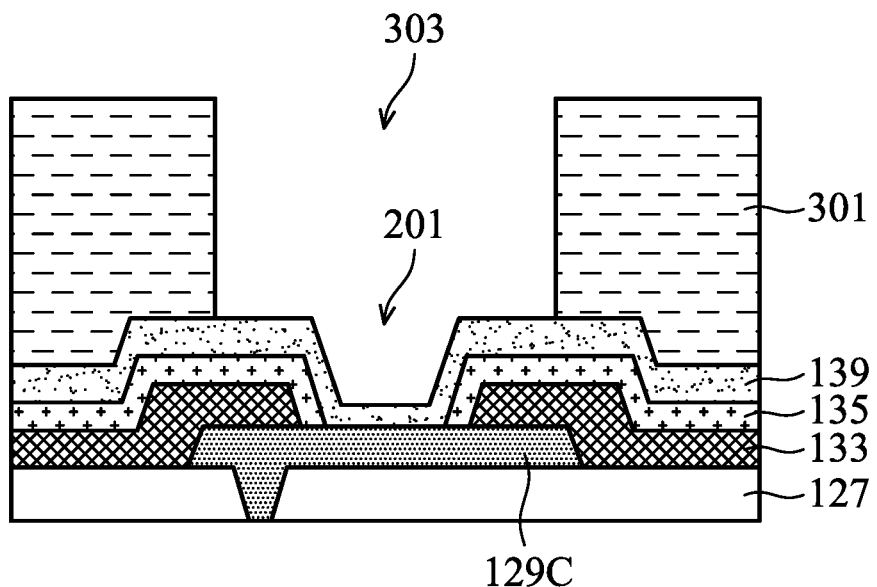

Referring to FIG. 3, a patterned mask 301 is formed over the UBM layer 139. In some embodiments, the patterned mask 301 comprises a photoresist material, or any photo-patternable material. In some embodiments, a material of the patterned mask 301 is patterned using a suitable photolithography technique to form an opening 303, thereby forming the patterned mask 301. The opening 303 exposes a portion of the UBM layer 139 formed over the conductive pads 129C in the opening 201.

Figure 4:
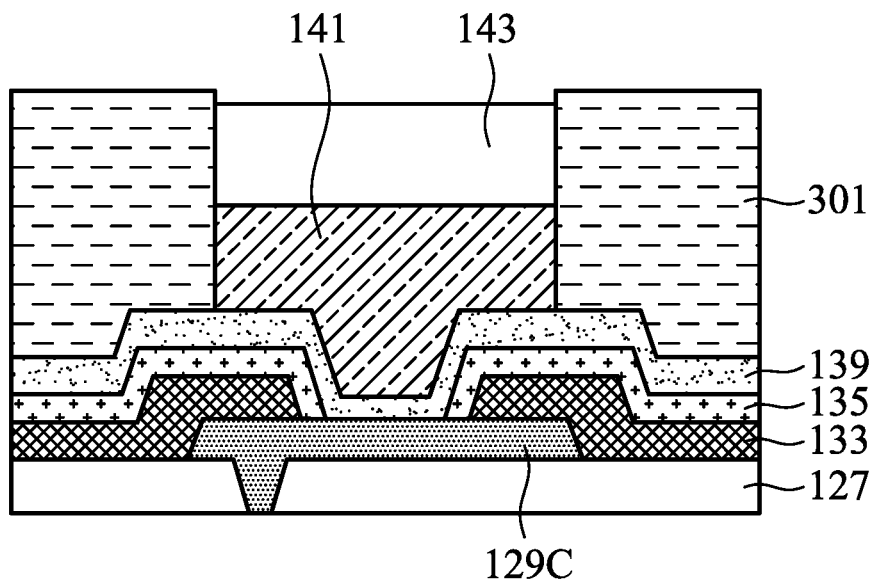

Referring to FIG. 4, the conductive pillar 141 is formed in a combined opening formed of the openings 201 and 303 (see FIG. 3). In some embodiments, the combined opening is filled with a suitable conductive material using an electrochemical plating process, an electroless plating process, ALD, PVD, a combination thereof, or the like. In some embodiments, the conductive pillar 141 partially fills the combined opening and a remaining portion of the combined opening is filled with a solder material to form the solder layer 143 over the conductive pillar 141. In some embodiments, the solder material may be formed using evaporation, an electro-chemical plating process, an electroless plating process, printing, solder transfer, a combination thereof, or the like.

Figure 5:
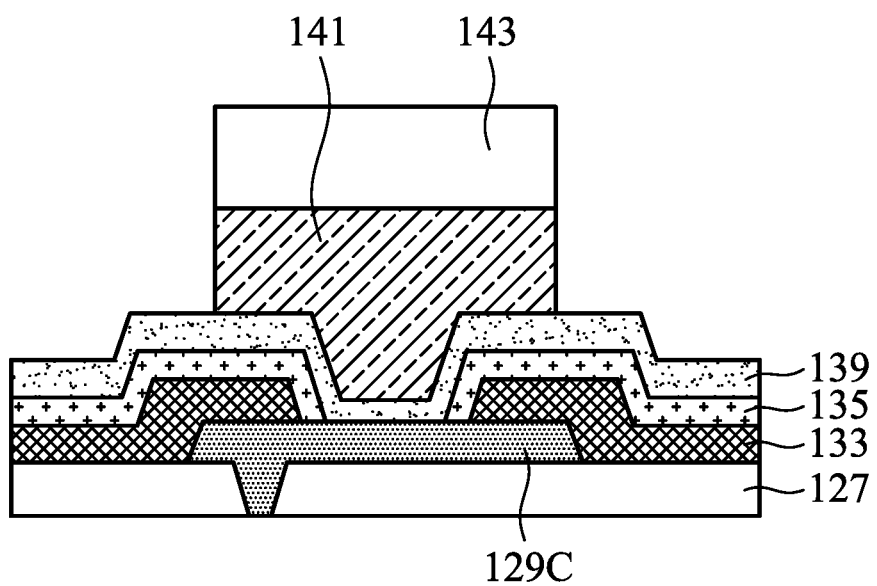

Referring to FIG. 5, after forming the conductive pillar 141 and the solder layer 143, the patterned mask 301 (see FIG. 4) is removed. In some embodiments, the patterned mask 301 comprising a photoresist material may be removed using, for example, an ashing process followed by a wet clean process.

Figure 6:
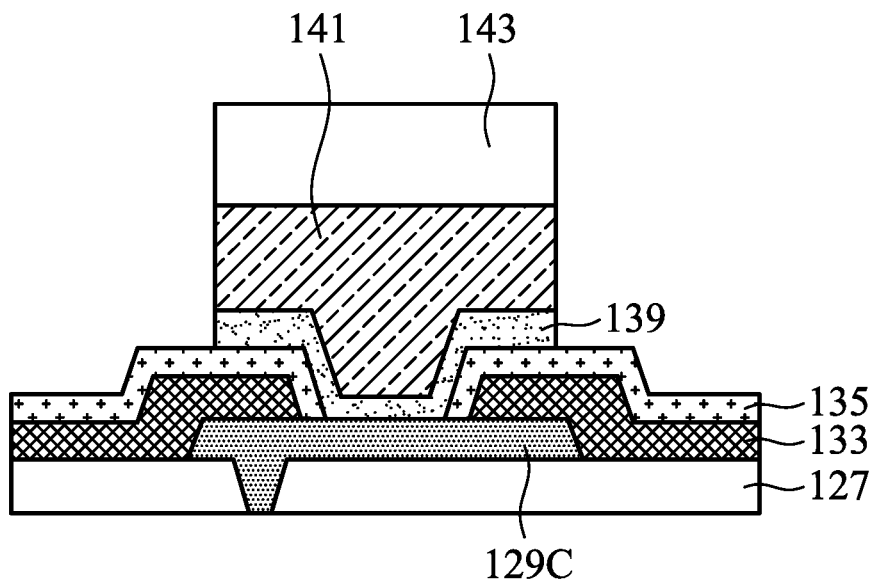

Referring to FIG. 6, after removing the patterned mask 301 (see FIG. 4), exposed portions of the UBM layer 139 are removed using, for example, one or more suitable etching processes.

Figure 7:
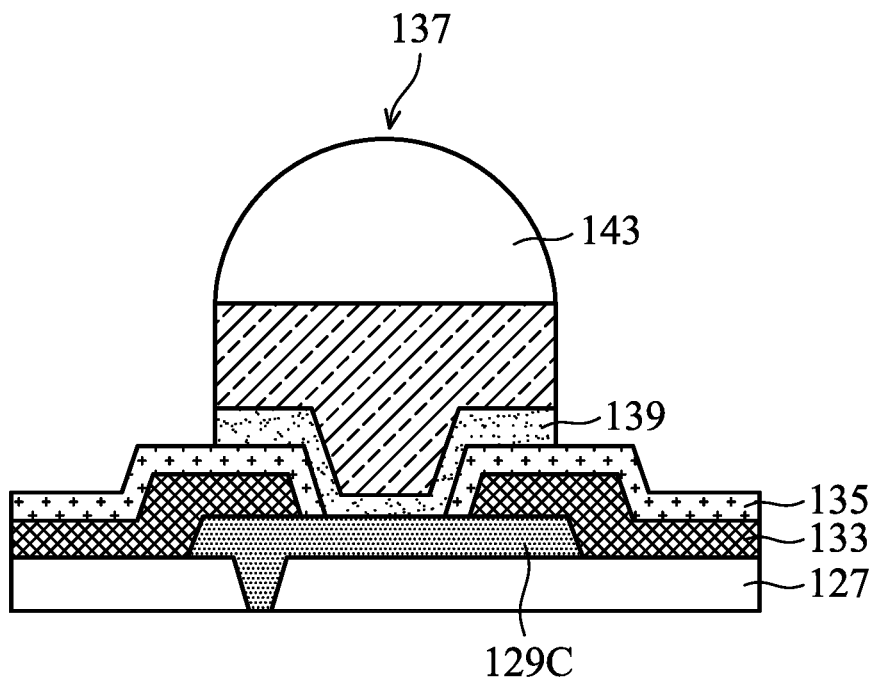

Referring to FIG. 7, after removing exposed portions of the UBM layer 139, a reflow process is performed on the solder layer 143 to reshape the solder material of the solder layer 143 into a desired shape.

Figure 8:
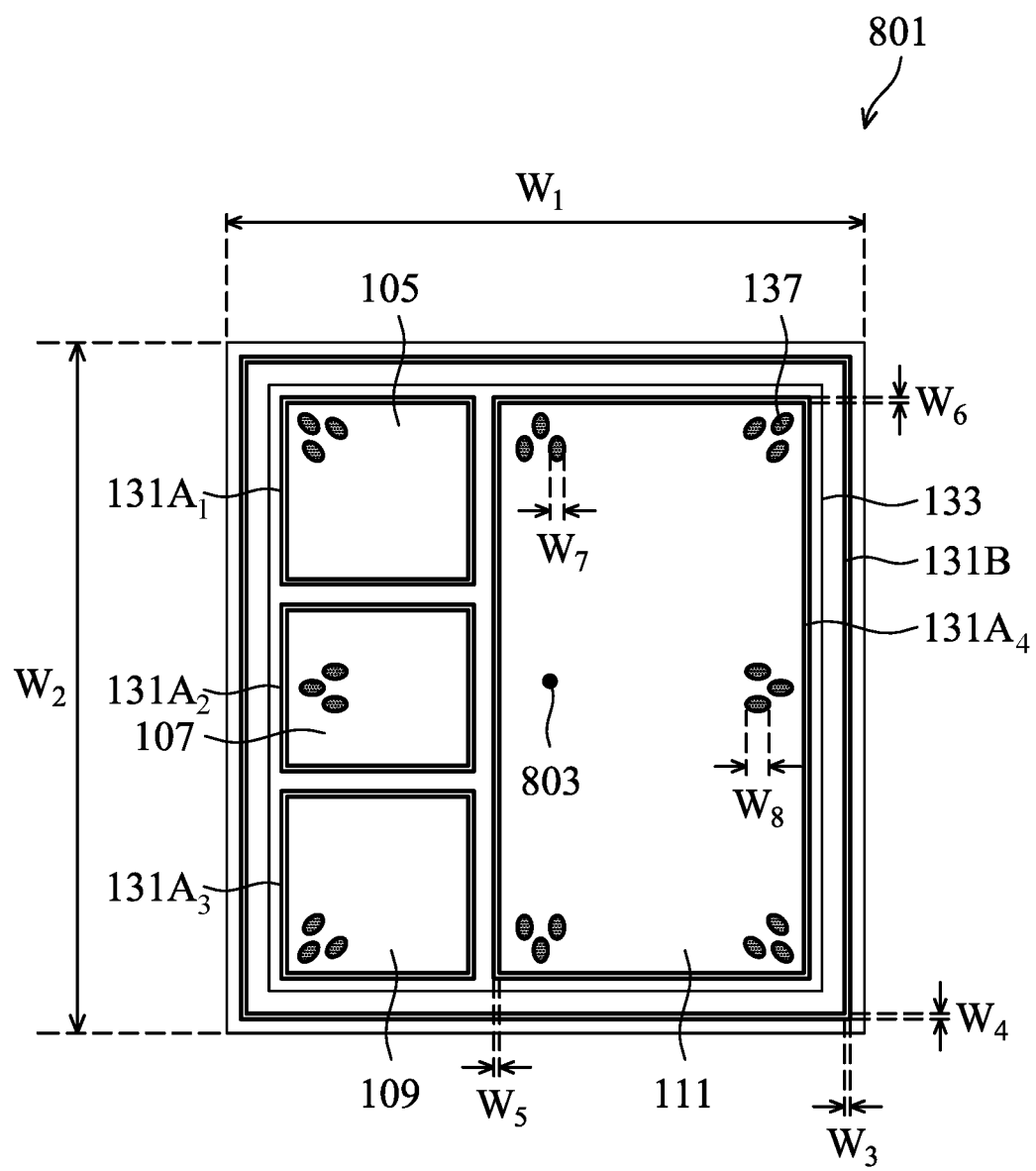
FIG. 8 illustrates a top view of a die structure in accordance with some embodiments.

Referring further to FIGS. 1A and 1B, 2-7, after forming the connectors 137 on the wafer 100, the unit regions 101 are singulated along the scribe lines 103 between adjacent seal rings 131B to form individual die structures, such as a die structure 801 illustrated in FIG. 8. The singulation process may comprise a sawing process, an etching process, a laser ablation process, a combination thereof, or the like. The seal rings 131B protect various features of the unit regions 101 during singulation and may reduce or prevent the formation of defects (e.g., delamination, cracking, and the like). Referring to FIG. 8, since the die structure 801 corresponds to the respective unit region 101 (see FIG. 1A), the connectors 137 are oriented with respect to a center 803 of the die structure 801, which coincides with the center 147 of the respective unit region 101. In some embodiments where the die structure 801 has a rectangular plan-view shape, the die structure 801 has a first width $W_1$ and a second width $W_2$ in a plan view. In some embodiments, the first width $W_1$ of the die structure 801 may be greater then, equal to, or less than the second width $W_2$ of the die structure 801. In some embodiments, the first width $W_1$ of the die structure 801 may be less than about 26 mm, such as about 26 mm. In some embodiments, the second width $W_2$ of the die structure 801 may be less than about 32 mm, such as about 32 mm. In some embodiments, the seal ring 131B has a first width $W_3$ and a second width $W_4$ in a plan view. In some embodiments, the first width $W_3$ of the seal ring 131B may be greater then, equal to, or less than the second width $W_4$ of the seal ring 131B. In some embodiments, the first width $W_3$ may equal to the second width $W_4$ and may equal to about 21.6 µm. In some embodiments, the seal ring $131A_1$-$131A_4$ has a first width $W_5$ and a second width $W_6$ in a plan view. In some embodiments, the first width $W_5$ of the seal ring $131A_1$-$131A_4$ may be greater then, equal to, or less than the second width $W_6$ of the seal ring $131A_1$-$131A_4$. In some embodiments, the first width $W_5$ may equal to the second width $W_6$ and may equal to about 21.6 µm. The connectors 137 have a first width $W_7$ along a short axis and a second width $W_8$ along a long axis in a plan view. In some embodiments, the first width $W_7$ of the connectors 137 is less than the second width $W_8$ of the connectors 137. In some embodiments, the first width $W_7$ of the connectors 137 is between about 30 µm and about 210 µm. In some embodiments, the second width $W_8$ of the connectors 137 is between about 40 µm and about 270 µm. In some embodiments, a ratio $W_7/W_8$ is between about 0.75 and about 0.80.

Figure 9A:
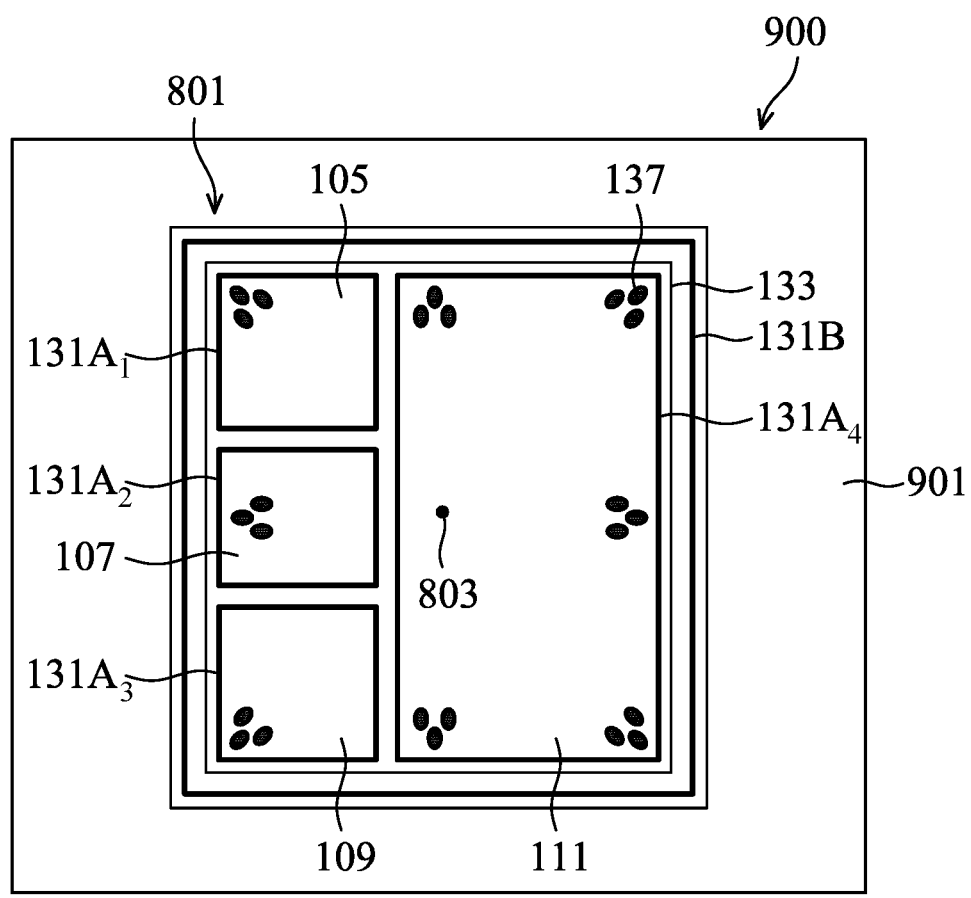
FIGS. 9A and 9B illustrate top and cross-sectional views of a package in accordance with some embodiments.
Figure 9B:
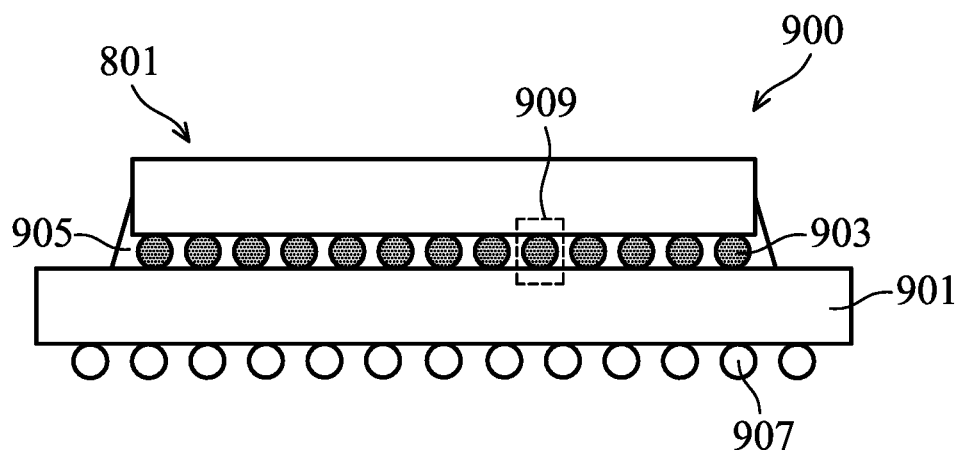

FIGS. 9A and 9B illustrate top and cross-sectional views of a package 900 in accordance with some embodiments. The package 900 comprises the die structure 801 attached to a substrate 901 using bonding structures 903. An underfill material 905 is formed between the die structure 801 and the substrate 901 and around the bonding structures 903. The underfill material 905 may, for example, be a liquid epoxy, deformable gel, silicon rubber, or the like, that is dispensed between the structures, and then cured to harden. This underfill material 905 may be used, among other things, to reduce damage to and to protect the bonding structures 903. Process steps for bonding the die structure 801 to the substrate 901 and for forming the bonding structures 903 are illustrated below with reference to FIGS. 10 and 11, and the detailed description is provided at that time. In some embodiments, the substrate 901 may include a portion of semiconductor wafer similar to the substrate 113 described above with reference to FIGS. 1A and 1B, and the description is not repeated herein. In some embodiments, the substrate 901 also includes passive devices such as resistors, capacitors, inductors and the like, or active devices such as transistors. In some embodiments, the substrate 901 includes additional integrated circuits. The substrate 901 may further include through substrate vias (TSVs) and may be an interposer. In some embodiments, the substrate 901 may be a package substrate, a packaged die, a die structure, or the like. In some embodiments, the substrate 901 further includes connectors 907 that may be used to mechanically and electrically connect the package 900 to external components such as a die structure, a printed circuit board, another package, or the like. In some embodiments, the connectors 907 may be solder balls, controlled collapse chip connection (C4) bumps, ball grid array (BGA) balls, micro bumps, electroless nickel-electroless palladium-immersion gold technique (ENEPIG) formed bumps, or the like.

Figure 10:
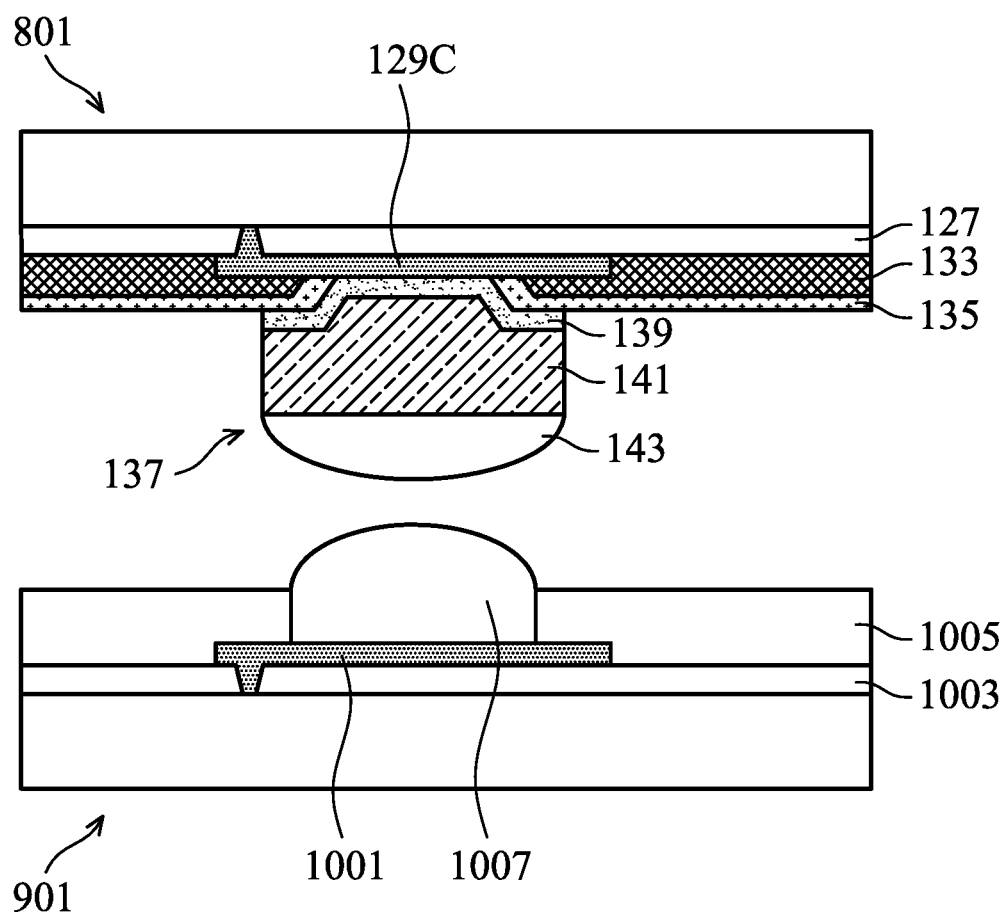
FIGS. 10 and 11 illustrate the cross-sectional views of intermediate stages in the formation of a package and bonding structures in accordance with some embodiments.
Figure 11:
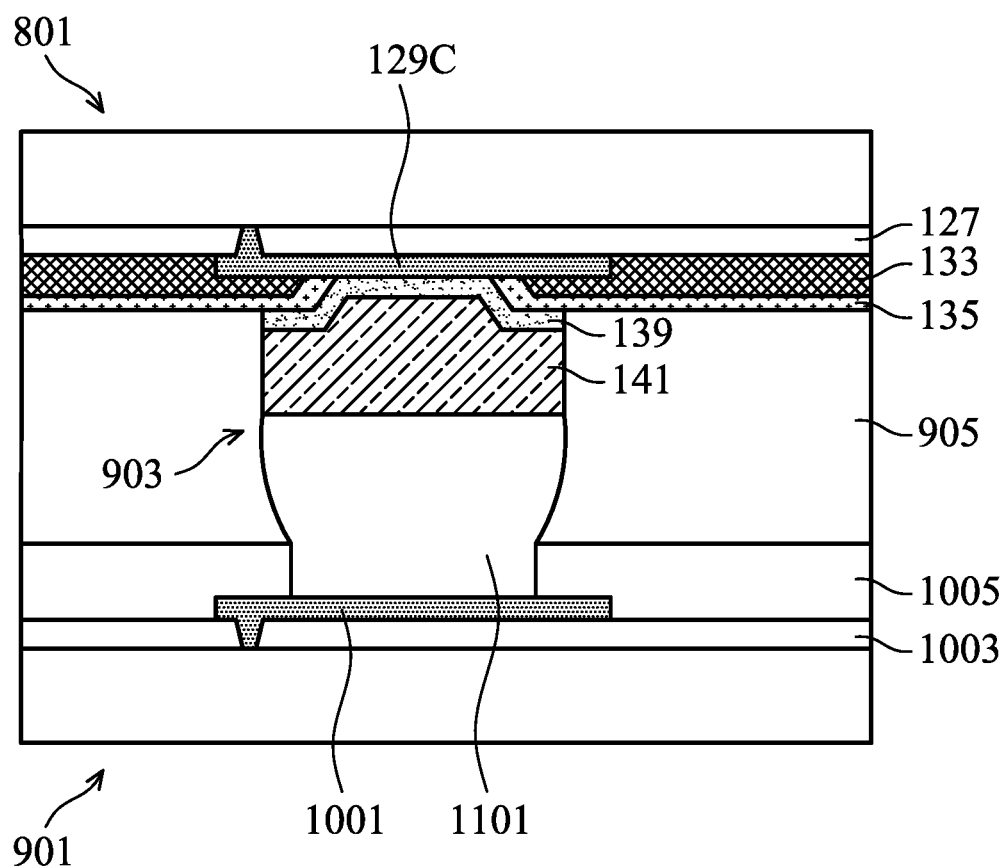

FIGS. 10 and 11 illustrate the cross-sectional views of intermediate stages in the formation of the package 900 and the bonding structures 903 (see FIGS. 9A and 9B) in accordance with some embodiments. FIGS. 10 and 11 illustrate a magnified view of portions the substrate 901 and the die structure 801, which are to become a portion 909 of the package 900 (see FIG. 9B) after the bonding process is completed. FIG. 10 illustrates a relative position of the die structure 801 and the substrate 901 prior to performing the bonding process to form the package 900. The substrate 901 may comprise conductive pads, such as a conductive pad 1001, interposed between the passivation layers 1003 and 1005. In some embodiments, the passivation layers 1003 and 1005 may be formed using similar materials and methods as the passivation layer 127 described above with reference to FIGS. 1A and 1B, and the description is not repeated herein. The conductive pad 1001 may be formed using similar materials and methods as the conductive pad 129C described above with reference to FIGS. 1A and 1B, and the description is not repeated herein. The conductive pad 1001 is partially covered by the passivation layer 1005. A solder layer 1007 is formed over the conductive pad 1001 to fill an opening formed in the passivation layer 1005 for subsequent bonding with the solder layer 143 or the conductive pillar 141 (if the solder layer 143 is omitted) of the corresponding connector 137 of the die structure 801. The solder layer 1007 may be formed using similar materials and methods as the solder layer 143 described above with reference to FIGS. 1A, 1B, 4-7, and the description is not repeated herein.

Referring to FIG. 11, the solder layers 143 and 1007 (see FIG. 10) are brought into physical contact and a reflow process is performed to merge the solder layers 143 and 1007 into a common solder layer 1101, which bonds the conductive pad 1001 to the conductive pillar 141. The UBM layer 139, the conductive pillar 141 and the solder layer 1101 form a bonding structure 903.

Referring further to FIGS. 9A, 9B, 10 and 11, due to different coefficients of thermal expansion (CTE) between materials in the die structure 801 and the substrate 901, their relative positions can shift during or after performing a thermal treatment, such as the reflow process described above. In some embodiments, the shifting of relative positions may cause misalignment between the connectors 137 of the die structure 801 and the respective solder layers 1007 of the substrate 901, and degrade electrical and mechanical functionality of the bonding structures 903. In some embodiments, the shifting of the relative positions is more prominent at the edges relative to centers of the die structure 801 and the substrate 901. To avoid misalignment between the connectors 137 of the die structure 801 and the respective solder layers 1007 of the substrate 901, the connectors 137 arranged such that a long axis of an elongated plan-view shape of each of the connectors 137 points substantially to the center 803 of the die structure 801 to maximize a bonding area between the connectors 137 and the respective solder layers 1007. In some embodiments, the connectors 137 of the die structure 801 are arranged such that a long axis of an elongated plan-view shape of each of the connectors 137 further points substantially to a center of the substrate 901. In such embodiments, the center of the substrate 901 coincides with the center 803 of the die structure 801 in a plan view. Such arrangement and shape of the connectors 137, and consequently of the bonding structures 903, reduces the stress on the bonding structures 903. Furthermore, stress exerted on various layers of the die structure 801 (such as, for example, the dielectric layers 117 illustrated in FIG. 1B) that arises due to the CTE mismatch between the die structure 801 and the substrate 901 during the bonding process (such as, for example, a reflow process) may be reduced, which may prevent cracking or delamination of the various layers of the die structure 801.

Figure 12A:
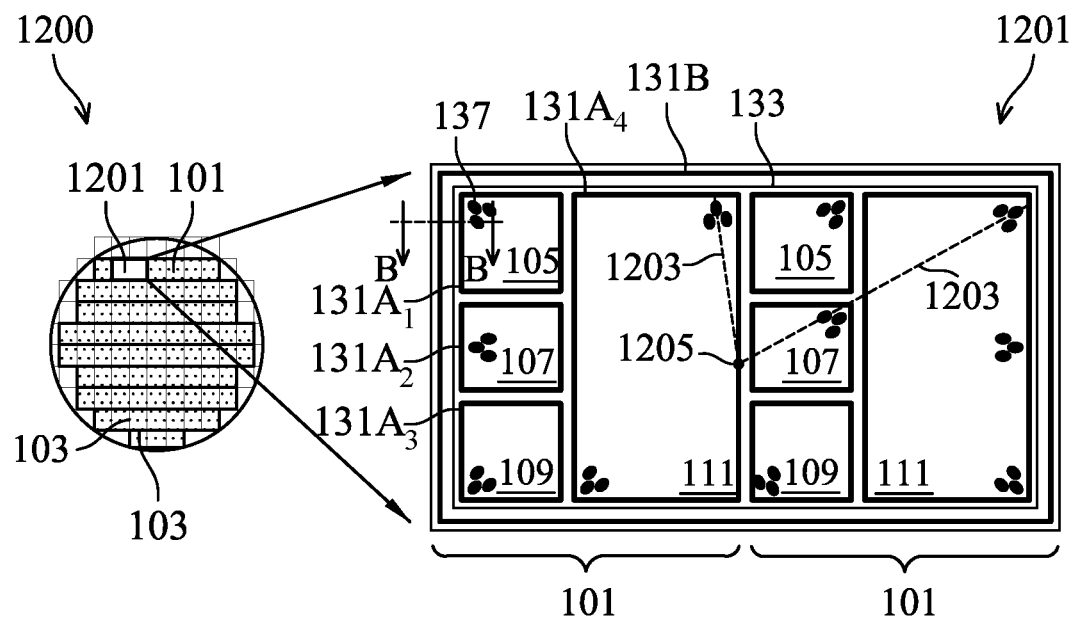
FIGS. 12A and 12B illustrate top and cross-sectional views of a wafer in accordance with some embodiments.
Figure 12B:
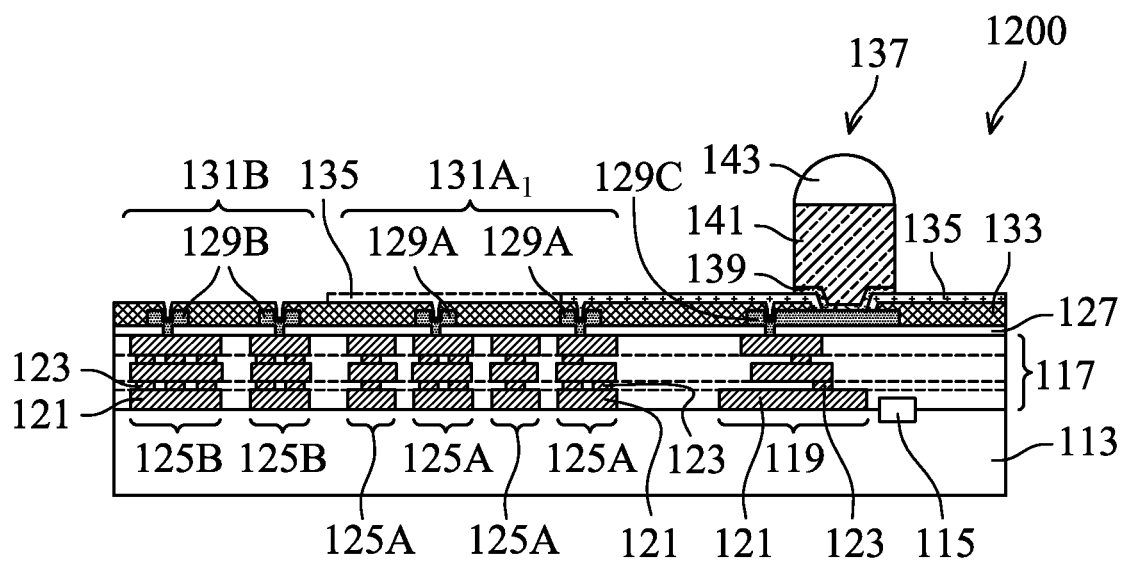

FIGS. 12A and 12B illustrate top and cross-sectional views of a wafer 1200 in accordance with some embodiments. FIG. 12A illustrates a top view of the wafer 1200, while FIG. 12B illustrates a cross-sectional view of the wafer 1200 along a line BB shown in FIG. 12A. In some embodiments, the wafer 1200 is similar to the wafer 100, with like features being labeled by like numerical references, and the description of the like features is not repeated herein. In some embodiments, the wafer 1200 comprises unit regions 101 separated by scribe lines 103. In some embodiments, the wafer 1200 may be formed using similar materials and method as the wafer 100 described above with reference to FIGS. 1A, 1B, 2-7, and the description is not repeated herein. In some embodiments, the seal rings 131B are formed such that each of the seal rings 131B encircles two adjacent unit regions 101 to form a two-unit region 1201. In some embodiments, the connectors 137 are formed over the two-unit region 1201 such that a line 1203 extending along a long axis of an elongated plan-view shape of each of the connectors 137 intersects with a center 1205 of a respective one of the two-unit region 1201. In some embodiments, the center 1205 may be a center of an area enclosed by the seal ring 131B. The number and locations of the connectors 137 as illustrated in FIG. 12A are provided as an example only. In other embodiments, the number and locations of the connectors 137 may be varied according to design requirements of the resulting packaged device.

Figure 13:
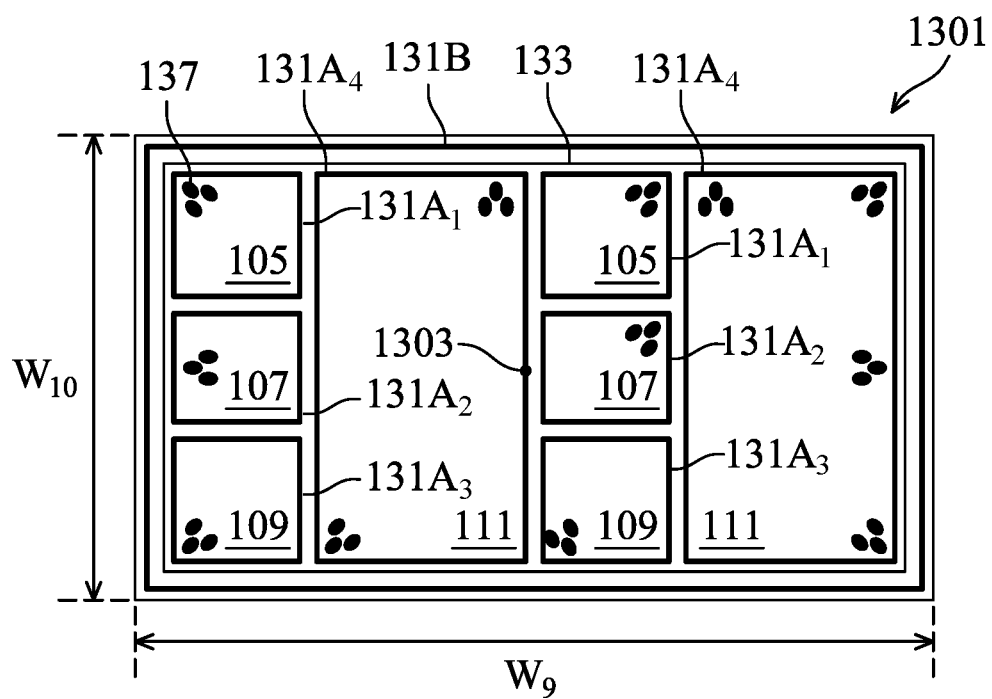
FIG. 13 illustrates a top view of a die structure in accordance with some embodiments.

Referring further to FIGS. 12A and 12B, after forming the connectors 137 on the wafer 1200, the two-unit regions 1201 are singulated along the scribe lines 103 between adjacent seal rings 131B to form individual die structures, such as a die structure 1301 illustrated in FIG. 13. The singulation process may comprise a sawing process, an etching process, a laser ablation process, a combination thereof, or the like. The seal rings 131B protect various features of the two-unit regions 1201 during singulation and may reduce or prevent the formation of defects (e.g., delamination, cracking, and the like). Referring to FIG. 13, since the die structure 1301 corresponds to the respective two-unit region 1201 (see FIG. 12A), the connectors 137 are oriented with respect to a center 1303 of the die structure 1301, which coincides with the center 1205 of the respective two-unit region 1201. In some embodiments where the die structure 1301 has a rectangular plan-view shape, the die structure 1301 has a first width $W_9$ and a second width $W_{10}$ in a plan view. In some embodiments, the first width $W_9$ of the die structure 1301 may be greater then, equal to, or less than the second width $W_{10}$ of the die structure 1301. In some embodiments, the first width $W_9$ of the die structure 1301 is between about 26 mm and about 286 mm. In some embodiments, the second width $W_{10}$ of the die structure 1301 is between about 32 mm and about 288 mm. The die structure 1301 may be also referred to as a 2× reticle structure, while the die structure 801 (see FIG. 8) may be also referred to as a 1× reticle structure.

Figure 14A:
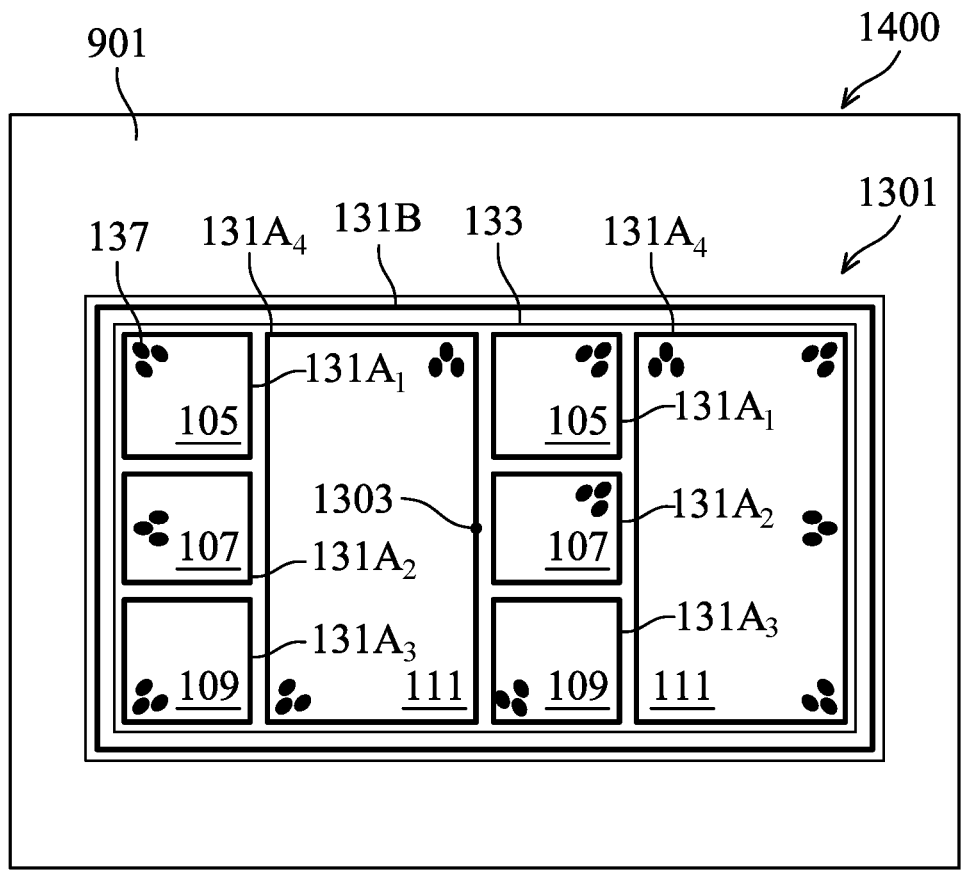
FIGS. 14A and 14B illustrate top and cross-sectional views of a package in accordance with some embodiments.
Figure 14B:
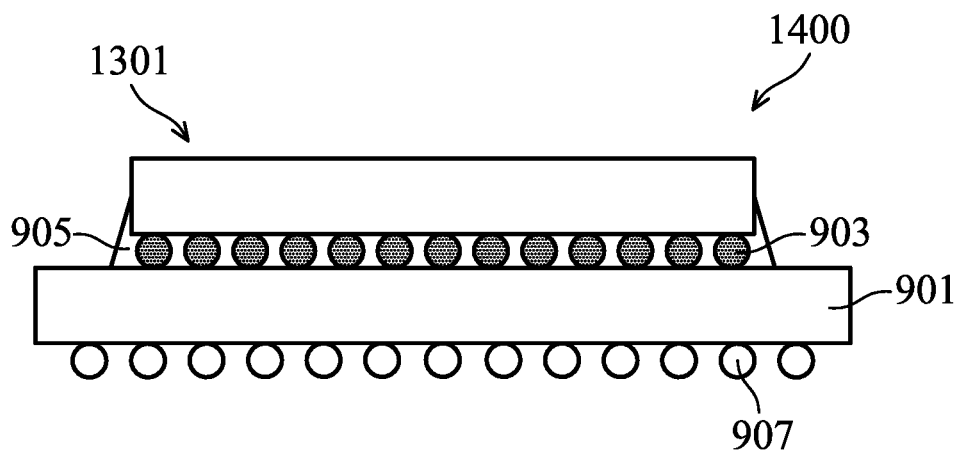

FIGS. 14A and 14B illustrate top and cross-sectional views of a package 1400 in accordance with some embodiments. The package 1400 is similar to the package 900 illustrated in FIGS. 9A and 9B, with like features being labeled by like numerical references, and the description of the like features is not repeated herein. The package 1400 comprises the die structure 1301 attached to a substrate 901 using bonding structures 903. In some embodiments, the die structure 1301 may be bonded to the substrate 901 using process steps described above with reference to FIGS. 10 and 11, and the description is not repeated herein. In some embodiments, the center 1303 of the die structure 1301 may coincide with a center of the substrate 901 in a plan view.

Figure 15:
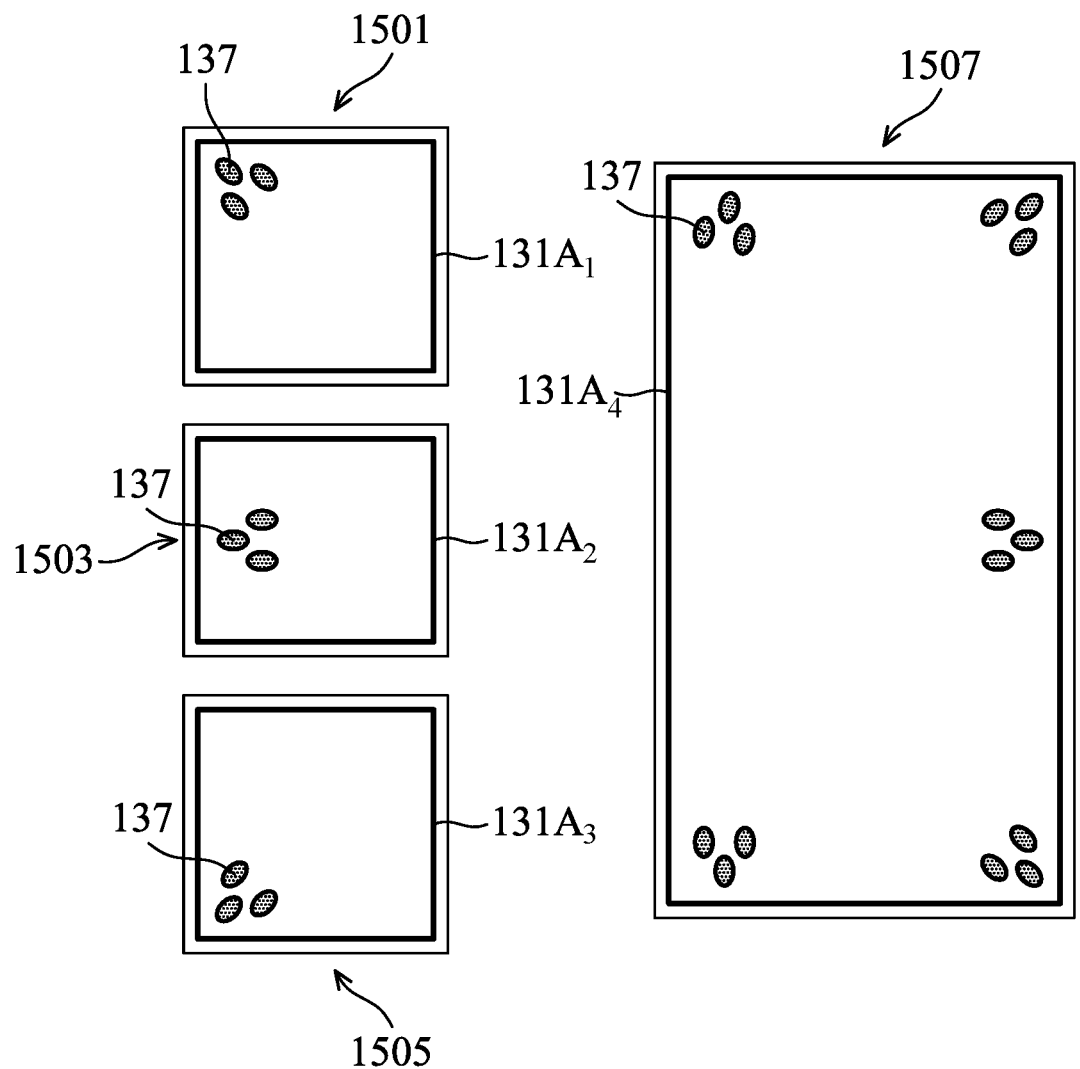
FIG. 15 illustrates top views of die structures in accordance with some embodiments.

Referring to FIGS. 1A, 1B and 15, in some embodiments, the formation of the seal rings 131B are omitted. In such embodiments, after forming the connectors 137 on the wafer 100, the die regions 105, 107, 109, 111 are singulated along areas between adjacent ones of the seal rings $131A_1$-$131A_4$ to form individual die structures, such as die structures 1501, 1503, 1505, and 1507 illustrated in FIG. 15. The singulation process may comprise a sawing process, an etching process, a laser ablation process, a combination thereof, or the like. The seal rings $131A_1$-$131A_4$ protect various features of the die regions 105, 107, 109, and 111, respectively, during singulation and may reduce or prevent the formation of defects (e.g., delamination, cracking, and the like). The die structure 1501 corresponds to the die region 105, the die structure 1503 corresponds to the die region 107, the die structure 1505 corresponds to the die region 109, and the die structure 1507 corresponds to the die region 111.

Figure 16A:
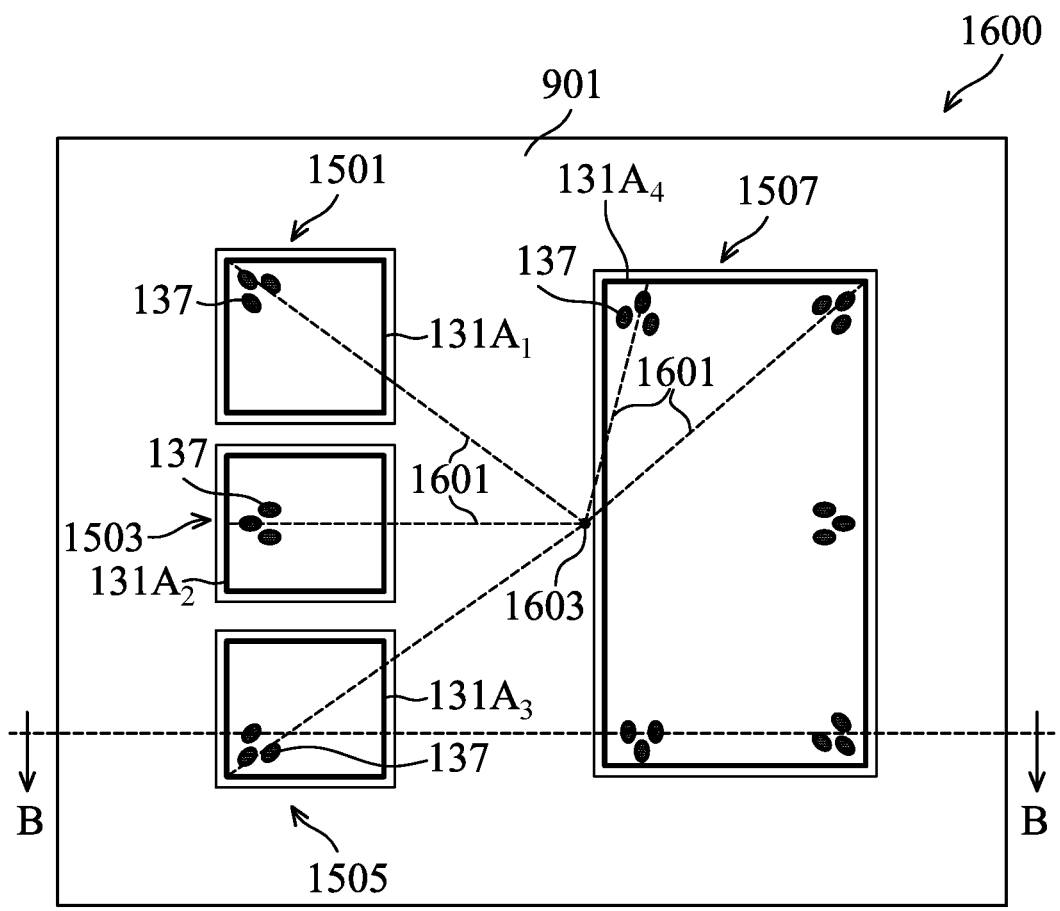
FIGS. 16A and 16B illustrate top and cross-sectional views of a package in accordance with some embodiments.
Figure 16B:
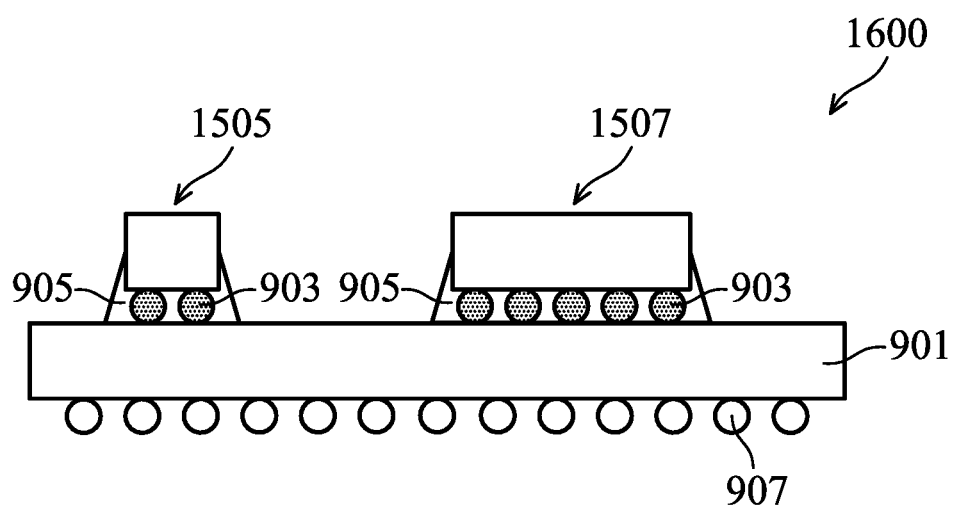

FIGS. 16A and 16B illustrate top and cross-sectional views of a package 1600 in accordance with some embodiments. FIG. 16A illustrates a top view of the package 1600, while FIG. 16B illustrates a cross-sectional view of the package 1600 along a line BB shown in FIG. 16A. The package 1600 is similar to the package 900 illustrated in FIGS. 9A and 9B, with like features being labeled by like numerical references, and the description of the like features is not repeated herein. The package 1600 comprises the die structures 1501, 1503, 1505 and 1507 attached to a substrate 901 using bonding structures 903. An underfill material 905 is formed between the die structures 1501, 1503, 1505 and 1507 and the substrate 901 and around the bonding structures 903. In some embodiments, the die structures 1501, 1503, 1505 and 1507 may be bonded to the substrate 901 using process steps described above with reference to FIGS. 10 and 11, and the description is not repeated herein. In some embodiments, the die structures 1501, 1503, 1505 and 1507 are arranged on the substrate 901 such that a line 1601 extending along a long axis of an elongated plan-view shape of each of the connectors 137 intersects with a center 1603 of the substrate 901.

Figure 17A:
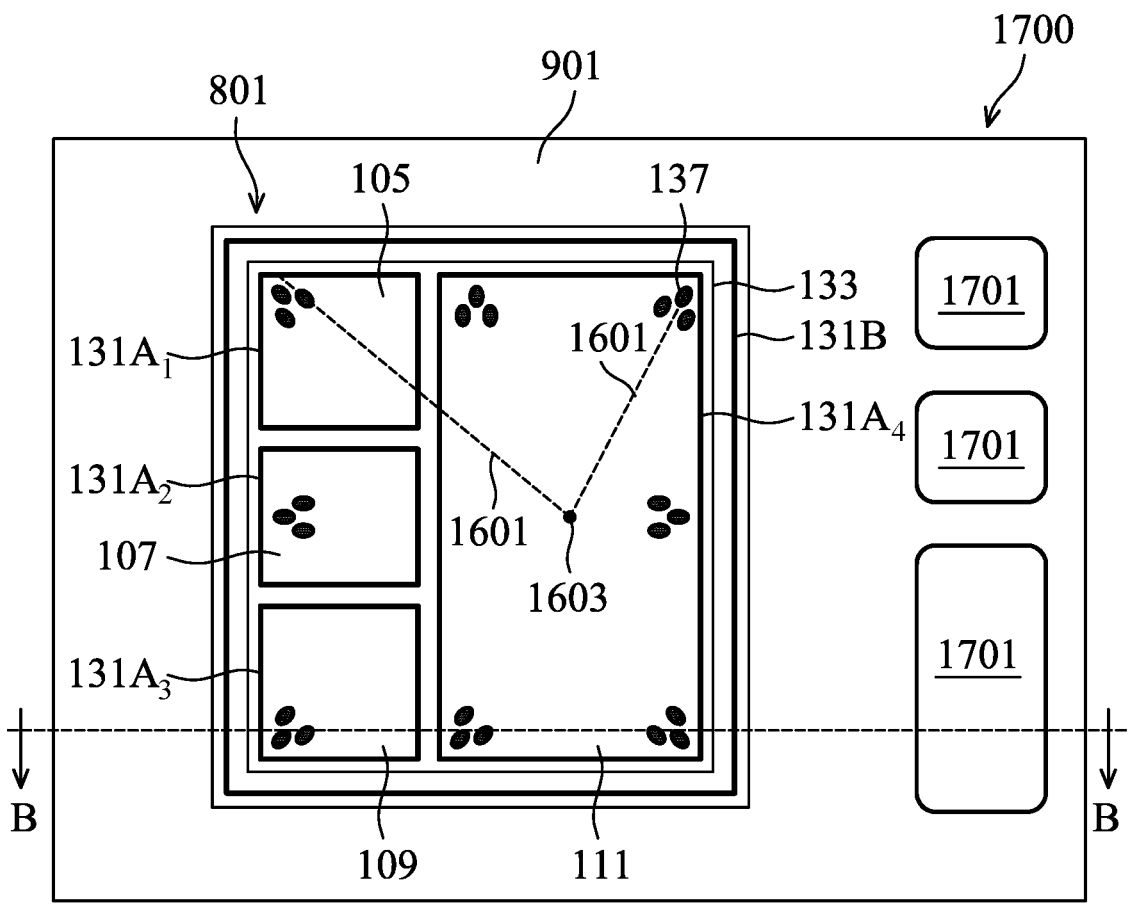
FIGS. 17A and 17B illustrate top and cross-sectional views of a package in accordance with some embodiments.
Figure 17B:
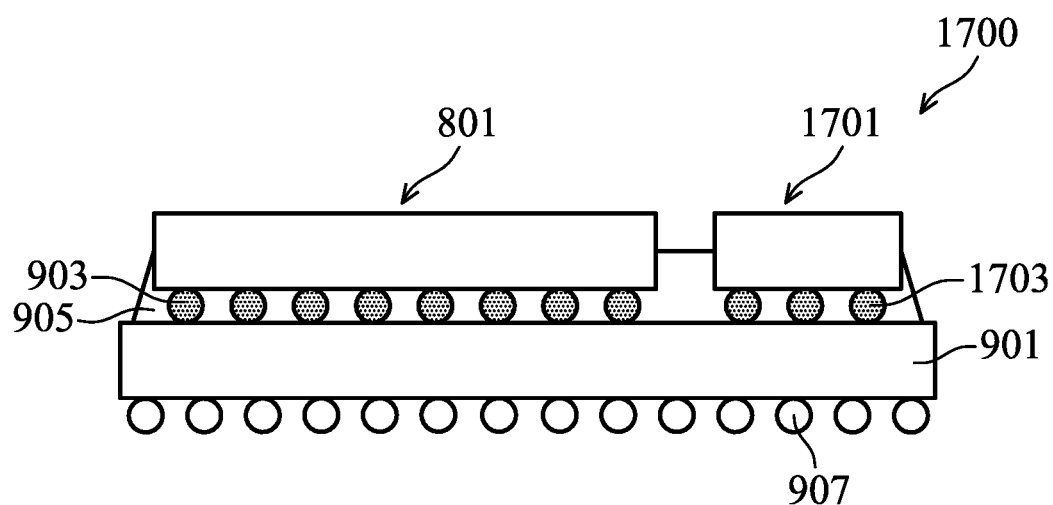

FIGS. 17A and 17B illustrate top and cross-sectional views of a package 1700 in accordance with some embodiments. FIG. 17A illustrates a top view of the package 1700, while FIG. 17B illustrates a cross-sectional view of the package 1700 along a line BB shown in FIG. 17A. The package 1700 is similar to the package 900 illustrated in FIGS. 9A and 9B, with like features being labeled by like numerical references, and the description of the like features is not repeated herein. In addition to the die structure 801, the package 1700 further includes devices 1701 attached to the substrate 901 using bonding structures 1703. The devices 1701 may be discrete passive devices (DPDs), surfaces mounted devices (SMDs), combinations thereof, or the like. The devices 1701 may comprise one or more passive devices, such as resistors, capacitors, inductors, fuses, combinations thereof, or the like. In some embodiments, the bonding structures 1703 may be formed using similar materials and methods as the bonding structures 903 described above with reference to FIGS. 10 and 11, and the description is not repeated herein. In other embodiments, the bonding structures 1703 may be solder balls, C4 bumps, BGA balls, micro bumps, ENEPIG formed bumps, or the like. In some embodiments, the die structure 801 is arranged on the substrate 901 such that a line 1601 extending along a long axis of an elongated plan-view shape of each of the connectors 137 intersects with a center 1603 of the substrate 901.

Figure 18A:
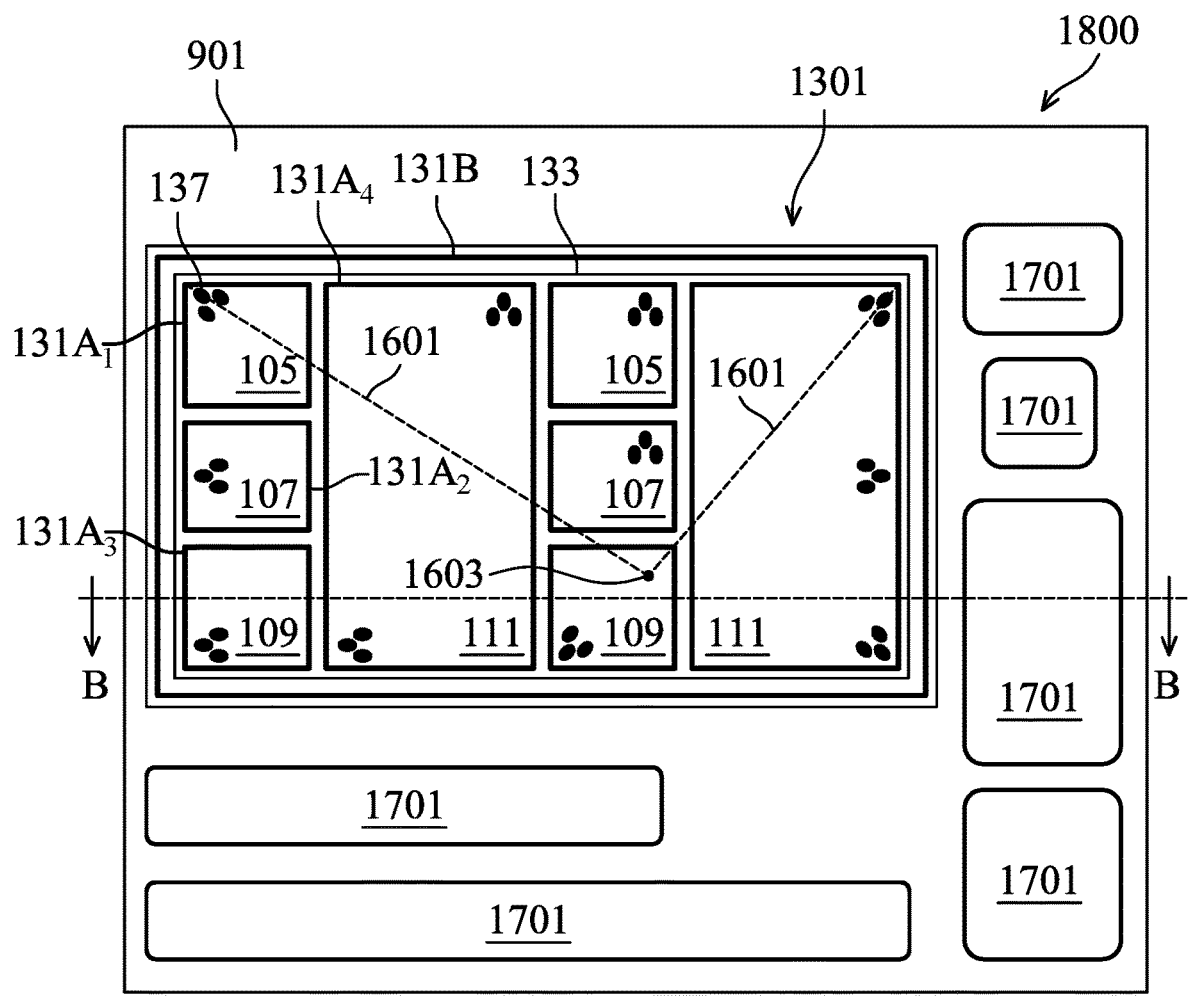
FIGS. 18A and 18B illustrate top and cross-sectional views of a package in accordance with some embodiments.
Figure 18B:
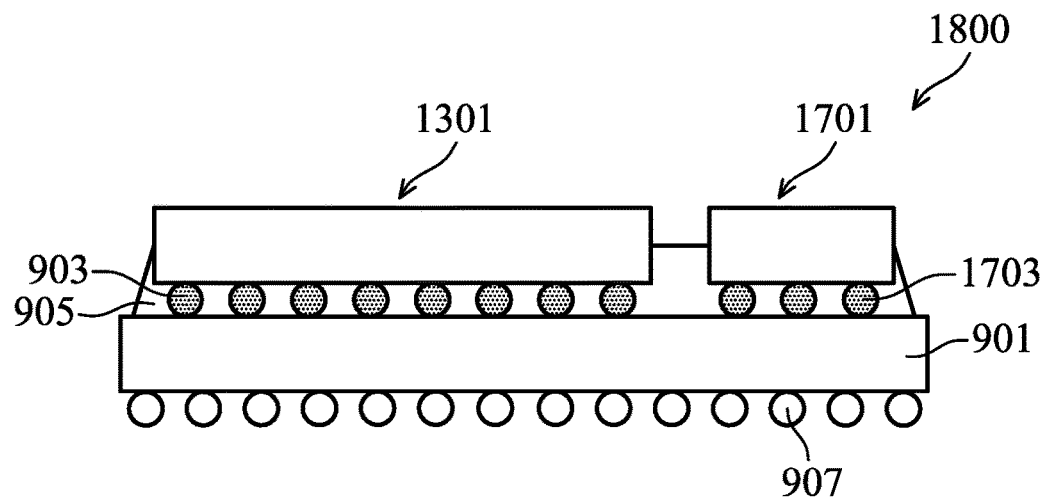

FIGS. 18A and 18B illustrate top and cross-sectional views of a package 1800 in accordance with some embodiments. FIG. 18A illustrates a top view of the package 1800, while FIG. 18B illustrates a cross-sectional view of the package 1800 along a line BB shown in FIG. 18A. The package 1800 is similar to the packages 1400 and 1700 illustrated in FIGS. 14A, 14B, 17A and 17B, with like features being labeled by like numerical references, and the description of the like features is not repeated herein. In distinction with the package 1700, the package 1800 comprises the die structure 1301 instead of the die structure 801. In some embodiments, the die structure 1301 is arranged on the substrate 901 such that a line 1601 extending along a long axis of an elongated plan-view shape of each of the connectors 137 intersects with a center 1603 of the substrate 901.

Figure 19:
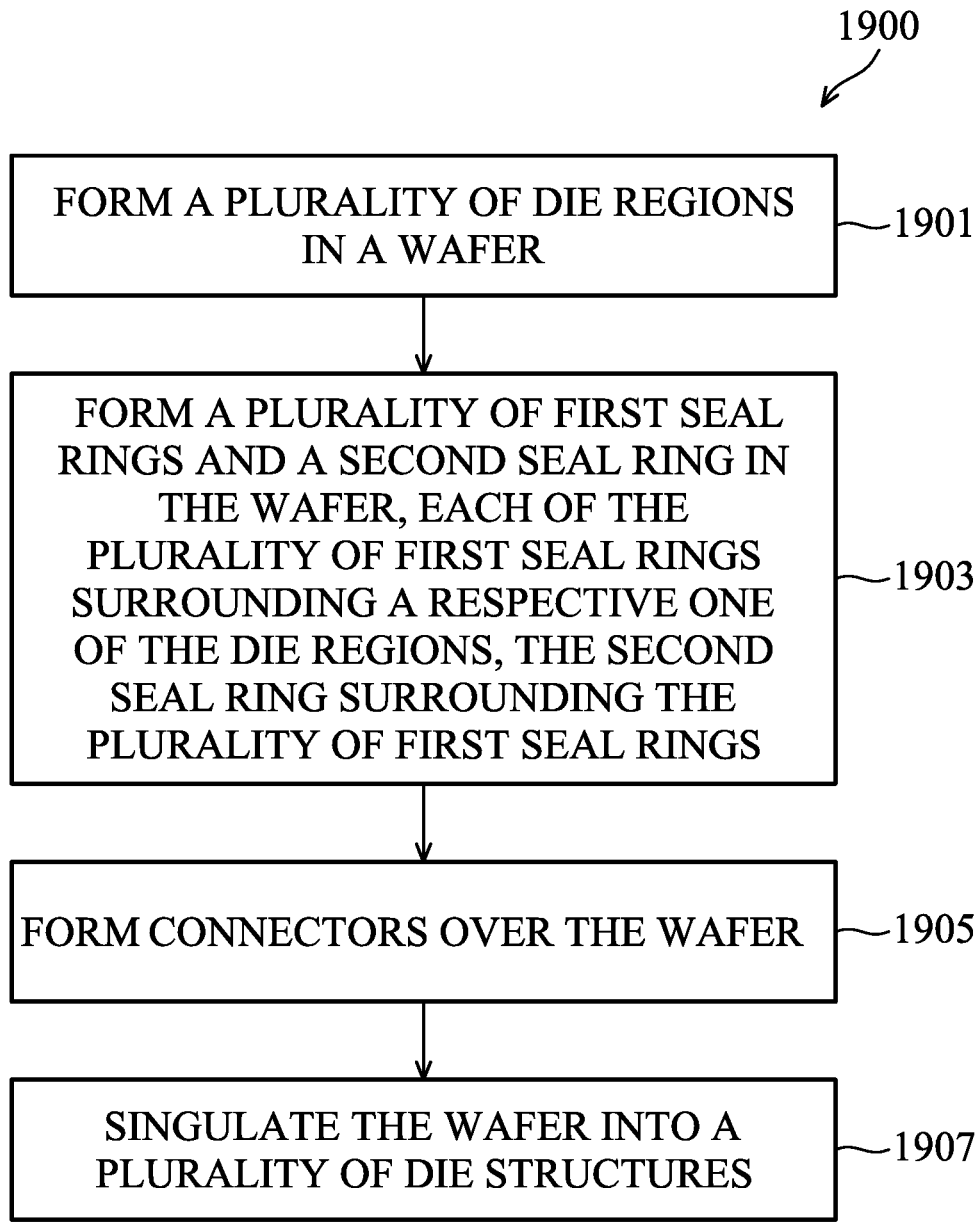
FIG. 19 is a flow diagram illustrating a method of forming die structures in accordance with some embodiments.

FIG. 19 is a flow diagram illustrating a method 1900 of forming die structures in accordance with some embodiments. The method 1900 starts with step 1901, where a plurality of die regions (such as the die regions 105, 107, 109, and 111 illustrated in FIG. 1A) are formed in a wafer (such as the wafer 100 illustrated in FIGS. 1A and 1B) as described above with reference to FIGS. 1A and 1B. In step 1903, a plurality of first seal rings (such as the seal rings 131A₁-131A₄ illustrated in FIGS. 1A and 1B) and a second seal ring (such as the seal ring 131B illustrated in FIGS. 1A and 1B) are formed in the wafer as described above with reference to FIGS. 1A and 1B. In some embodiments, each of the plurality of first seal rings surrounds a respective one of the die regions. In some embodiments, the second seal ring surrounds the plurality of first seal rings. In some embodiments, the plurality of first seal rings and the second seal ring are simultaneously formed by a same process. In such embodiments, a same mask (or masks) may be used to pattern features of the plurality of first seal rings and features of the second seal ring at a same time. In alternative embodiments, the plurality of first seal rings and the second seal ring are formed by different processes. In such embodiments, the plurality of first seal rings may be formed before or after forming the second seal ring using different masks at different times. In yet other alternative embodiments, the formation of the second seal ring may be omitted. In step 1905, connectors (such as the connectors 137 illustrated in FIGS. 1A and 1B) are formed over the wafer as described above with reference to FIGS. 1A, 1B, and 2-7. In step 1907, the wafer is singulated into a plurality of die structures (such as the die structure 801 illustrated in FIG. 8) as described above with reference to FIGS. 1A, 1B, and 8.

In accordance with an embodiment, a device including: a die structure including a plurality of die regions; a plurality of first seal rings, each of the plurality of first seal rings surrounding a corresponding die region of the plurality of die regions; a second seal ring surrounding the plurality of first seal rings; and a plurality of connectors bonded to the die structure, each of the plurality of connectors having an elongated plan-view shape, a long axis of the elongated plan-view shape of each of the plurality of connectors being oriented toward a center of the die structure. In an embodiment, the device further includes a substrate attached to the plurality of connectors. In an embodiment, the center of the die structure coincides with a center of the substrate in a plan view. In an embodiment, the center of the die structure coincides with a center of an area surrounded by the second seal ring. In an embodiment, each of the plurality of connectors includes: a conductive pillar; and a solder layer over the conductive pillar. In an embodiment, a first die region of the plurality of die regions has a first area in a plan view, a second die region of the plurality of die regions has a second area in the plan view, and the second area is different from the first area. In an embodiment, the elongated plan-view shape is an oval shape, an elliptical shape, or racetrack shape.

In accordance with another embodiment, a device including: a die structure including a first region and a second region, the first region including a plurality of first die regions, the second region including a plurality of second die regions; a plurality of first seal rings, each of the plurality of first seal rings surrounding a corresponding die region of the plurality of first die regions and the plurality of second die regions; a second seal ring surrounding the first region and the second region; and a plurality of connectors bonded to the die structure, each of the plurality of connectors having an elongated plan-view shape, a line extending along a long axis of the elongated plan-view shape of each of the plurality of connectors intersecting with a center of the die structure. In an embodiment, the first region and the second region have a same area in a plan view. In an embodiment, the second seal ring surrounds the plurality of first seal rings. In an embodiment, a number of die regions in the plurality of first die regions is same as a number of die regions in the plurality of second die regions. In an embodiment, the device further includes a substrate physically attached to the plurality of connectors. In an embodiment, the center of the die structure coincides with a center of the substrate in a plan view. In an embodiment, the center of the die structure coincides with a center of an area surrounded by the second seal ring.

In accordance with yet another embodiment, a method including: forming a plurality of unit regions in a wafer, each of the plurality of unit regions including a plurality of die regions; forming a plurality of first seal rings in the wafer, each of the plurality of first seal rings surrounding a corresponding die region of the plurality of die regions; forming a plurality of second seal rings in the wafer, each of the plurality of second seal rings surrounding a corresponding unit region of the plurality of unit regions; and forming a plurality of connectors over the wafer, each of the plurality of connectors having an elongated plan-view shape, a long axis of the elongated plan-view shape of each of the plurality of connectors being oriented toward a center of a corresponding unit region of the plurality of unit regions. In an embodiment, the method further includes singulating the wafer to form a plurality of die regions. In an embodiment, singulating the wafer includes sawing along areas of the wafer disposed between adjacent second seal rings. In an embodiment, each of the plurality of die regions comprises a corresponding unit region of the plurality of unit regions. In an embodiment, each of the plurality of die regions comprises a corresponding pair of unit regions of the plurality of unit regions. In an embodiment, the method further includes forming a plurality of interconnect structures in the wafer, wherein the plurality of interconnect structures, the plurality of first seal rings, and the plurality of second seal rings are simultaneously formed by a same process.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a plurality of unit regions in a wafer, each of the plurality of unit regions comprising a plurality of die regions;
    forming a plurality of first seal rings in the wafer, each of the plurality of first seal rings surrounding a corresponding die region of the plurality of die regions, wherein the plurality of first seal rings do not overlap with each other in a plan view;
    forming a plurality of second seal rings in the wafer, each of the plurality of second seal rings surrounding a corresponding unit region of the plurality of unit regions; and
    forming a plurality of connectors over the wafer, each of the plurality of connectors having an elliptical shape in a plan view, a long axis in the plan view of each of the plurality of connectors being oriented toward a center point in the plan view of a corresponding unit region of the plurality of unit regions.

2. The method of claim 1, further comprising singulating the wafer to form a plurality of die structures.

3. The method of claim 2, wherein singulating the wafer comprises sawing along areas of the wafer disposed between adjacent second seal rings.

4. The method of claim 2, wherein each of the plurality of die structures comprises a corresponding unit region of the plurality of unit regions.

5. The method of claim 2, wherein each of the plurality of die structures comprises a corresponding pair of unit regions of the plurality of unit regions.

6. The method of claim 1, further comprising forming a plurality of interconnect structures in the wafer, wherein the plurality of interconnect structures, the plurality of first seal rings, and the plurality of second seal rings are simultaneously formed by a same process.

7. The method of claim 1, wherein the plurality of die regions comprises a first die region, wherein a first longitudinal axis of a first connector in a first corner of the first die region and a second longitudinal axis of a second connector in a second corner of the first die region intersect at a point off outside a boundary of the first die region in a plan view.

8. A method comprising:
    forming a plurality of first seal rings in a first unit region on a wafer, each of the plurality of first seal rings surrounding a corresponding die region of a plurality of die regions in the first unit region;
    forming a second seal ring surrounding the plurality of first seal rings; and
    forming a plurality of connectors on each of the plurality of die regions, each of the plurality of connectors having an elongated plan-view shape in a plan view, a line extending along a longitudinal axis of the elongated plan-view shape in the plan view of each of the plurality of connectors intersecting a center in the plan view of the first unit region.

9. The method of claim 8, further comprising attaching a plurality of dies to the wafer, each die of the plurality of dies being attached to a corresponding die region of the plurality of die regions.

10. The method of claim 8, further comprising forming:
    forming a second unit region; and
    singulating the first unit region from the second unit region.

11. The method of claim 8, wherein each of the plurality of connectors comprises:
    a conductive pillar; and
    a solder layer over the conductive pillar.

12. The method of claim 8, wherein each of the plurality of first seal rings comprises a first plurality of conductive elements in a plurality of dielectric layers.

13. The method of claim 12, wherein the second seal ring comprises a second plurality of conductive elements in the plurality of dielectric layers.

14. The method of claim 8, wherein the plurality of first seal rings do not overlap with each other in a plan view.

15. A method comprising:
    forming a die structure, the die structure having a center point at an intersection of diagonals of the die structure in a plan view, the die structure comprising:
        a plurality of die regions;
        a plurality of first seal rings, each of the plurality of first seal rings surrounding a corresponding die region of the plurality of die regions; and
        a second seal ring surrounding the plurality of first seal rings; and
    bonding the die structure to a substrate using a plurality of connectors, the plurality of connectors being interposed between the substrate and the die structure, each of the plurality of connectors having an elongated plan-view shape in the plan view, a long axis in the plan view of the elongated plan-view shape of each of the plurality of connectors being oriented toward the center point of the die structure in the plan view, the center point of the die structure coinciding with a center point of the substrate in the plan view.

16. The method of claim 15, wherein the plurality of first seal rings do not overlap each other in the plan view.

17. The method of claim 15, wherein each of the plurality of first seal rings is spaced apart from adjacent ones of the plurality of first seal rings.

18. The method of claim 15, wherein a first connector of the plurality of connectors has a first width perpendicular to a longitudinal axis of first connector in a range between about 30 µm and about 210 µm.

19. The method of claim 18, wherein the first connector has a second width along the longitudinal axis of the first connector in a range between about 40 µm and about 270 µm.

20. The method of claim 19, wherein a ratio of the first width to the second width is in a range between 0.75 and 0.80.

* * * * *